US012581845B2

(12) United States Patent　　　　(10) Patent No.:　US 12,581,845 B2
Zheng et al.　　　　　　　　　　　　(45) Date of Patent:　Mar. 17, 2026

(54) MANUFACTURING METHOD OF ORGANIC DISPLAY PANEL AND ORGANIC DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Jiexin Zheng, Shenzhen (CN); Wei Lu, Shenzhen (CN)

( * ) Notice: Subject to any disclaimer, the term of this patent is extended or adjusted under 35 U.S.C. 154(b) by 582 days.

(21) Appl. No.: 17/778,872

(22) PCT Filed: Apr. 20, 2022

(86) PCT No.: PCT/CN2022/087875
§ 371 (c)(1),
(2) Date: May 23, 2022

(87) PCT Pub. No.: WO2023/178784
PCT Pub. Date: Sep. 28, 2023

(65) Prior Publication Data
US 2024/0172544 A1　　May 23, 2024

(30) Foreign Application Priority Data
Mar. 22, 2022　(CN) .......................... 202210286066.6

(51) Int. Cl.
H10K 71/16　　(2023.01)
H10K 59/12　　(2023.01)
(Continued)

(52) U.S. Cl.
CPC ......... H10K 71/16 (2023.02); H10K 59/1201 (2023.02); H10K 59/122 (2023.02);
(Continued)

(58) Field of Classification Search
CPC ........ H10K 7/16; H10K 71/60; H10K 59/131; H10K 59/1201
(Continued)

(56) References Cited

U.S. PATENT DOCUMENTS

| 2006/0125363 | A1* | 6/2006 | Tahira | .................... | H05B 33/10 |
| | | | | | 313/29 |
| 2007/0077349 | A1* | 4/2007 | Newman | .............. | H10K 50/814 |
| | | | | | 427/256 |

(Continued)

FOREIGN PATENT DOCUMENTS

| CN | 101739933 | A | 6/2010 |
| CN | 104157672 | A | 11/2014 |

(Continued)

OTHER PUBLICATIONS

International Search Report in International application No. PCT/CN2022/087875, mailed on Jun. 29, 2022.
(Continued)

*Primary Examiner* — Dzung Tran

(57)　　　　　ABSTRACT

A manufacturing method of an organic display panel and the organic display panel are provided by the present application and relate to a field of display technology. The present application mainly focuses on an evaporation process of an organic material on an array substrate to form an organic layer. An anode layer of the array substrate and the organic material after vaporization from an evaporation source are applied with different electric charges, so that the anode layer and the organic material after vaporization can attract each other under an action of an electric field during the evaporation process, thereby achieving a fixed-point deposition of the organic material on the anode layer, and preventing or hindering the organic material from depositing on the array substrate, such as the auxiliary electrode and other areas.

14 Claims, 4 Drawing Sheets

(51) Int. Cl.

| | | |
|---|---|---|
| *H10K 59/122* | (2023.01) | |
| *H10K 59/131* | (2023.01) | |
| *H10K 59/80* | (2023.01) | |
| *H10K 71/60* | (2023.01) | |

(52) U.S. Cl.
CPC ..... *H10K 59/131* (2023.02); *H10K 59/80516* (2023.02); *H10K 71/60* (2023.02)

(58) Field of Classification Search
USPC ........................................................... 257/40
See application file for complete search history.

(56) References Cited

U.S. PATENT DOCUMENTS

| | | | | |
|---|---|---|---|---|
| 2010/0155496 A1* | 6/2010 | Stark | ...................... | B05B 5/047 |
| | | | | 239/3 |
| 2012/0097931 A1* | 4/2012 | Cho | ..................... | H10K 71/135 |
| | | | | 438/35 |
| 2016/0315261 A1* | 10/2016 | Cho | ...................... | H10K 71/191 |
| 2018/0159038 A1* | 6/2018 | Leng | .......................... | B41J 2/04 |
| 2020/0381501 A1* | 12/2020 | Zeng | .................... | H10K 59/122 |

FOREIGN PATENT DOCUMENTS

| | | | |
|---|---|---|---|
| CN | 107579099 A | 1/2018 | |
| CN | 107623083 A | 1/2018 | |
| CN | 107706217 A | 2/2018 | |
| CN | 108300962 A | 7/2018 | |
| JP | 2003059660 A | 2/2003 | |
| JP | 2006202597 A | 8/2006 | |
| KR | 100929167 B1 | 12/2009 | |

OTHER PUBLICATIONS

Written Opinion of the International Search Authority in International application No. PCT/CN2022/087875, mailed on Jun. 29, 2022.

Chinese Office Action issued in corresponding Chinese Patent Application No. 202210286066.6 dated Jul. 19, 2024, pp. 1-7.

* cited by examiner

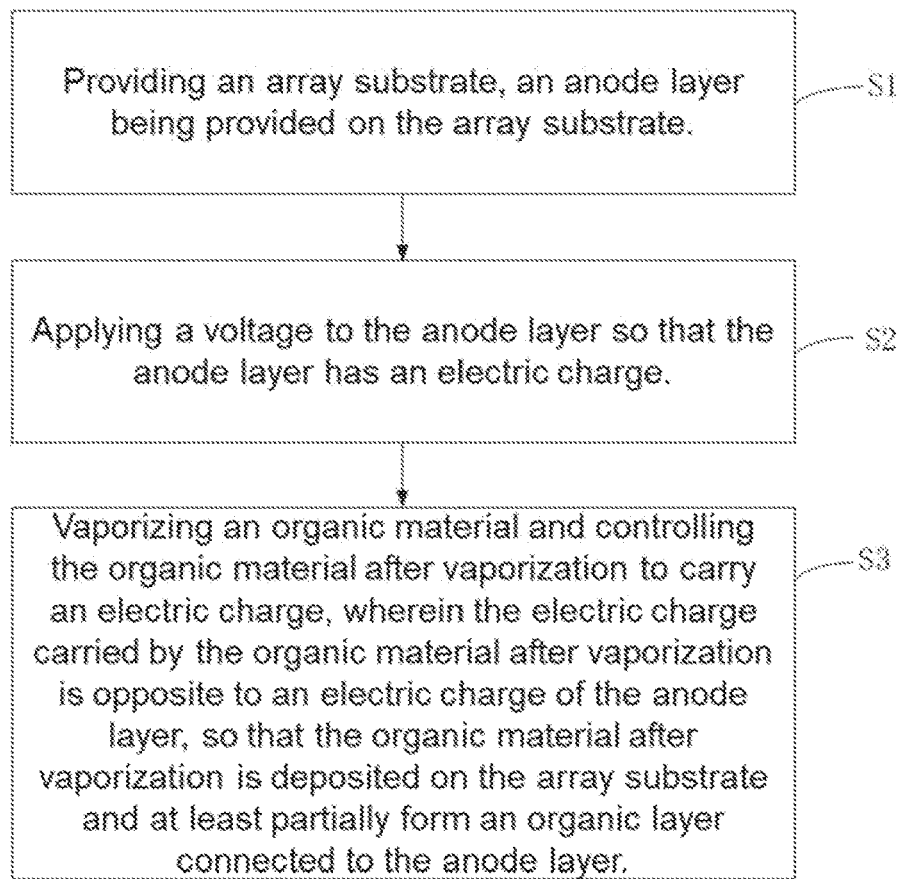

Providing an array substrate, an anode layer being provided on the array substrate. — S1

Applying a voltage to the anode layer so that the anode layer has an electric charge. — S2

Vaporizing an organic material and controlling the organic material after vaporization to carry an electric charge, wherein the electric charge carried by the organic material after vaporization is opposite to an electric charge of the anode layer, so that the organic material after vaporization is deposited on the array substrate and at least partially form an organic layer connected to the anode layer. — S3

FIG. 1

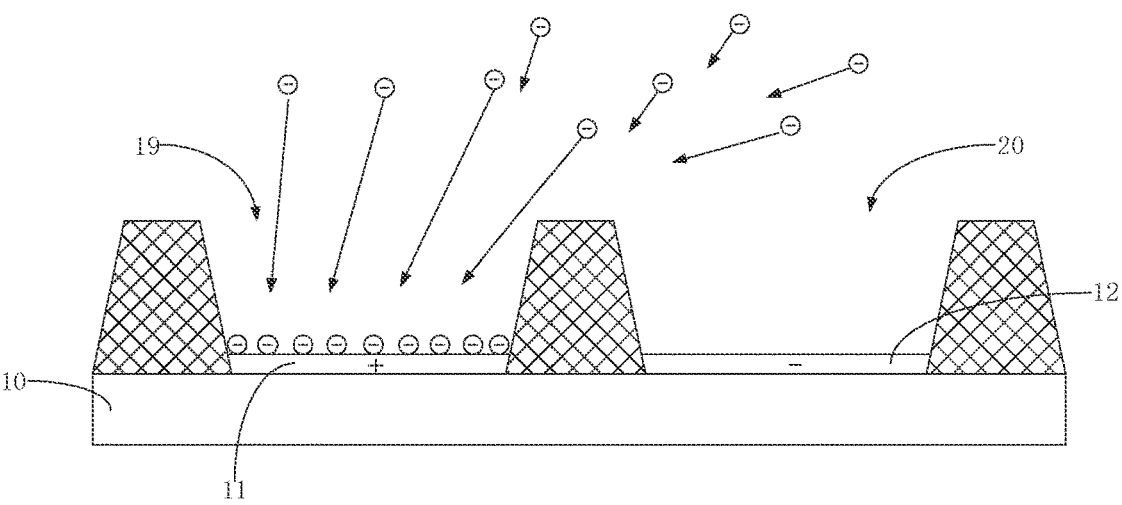

FIG. 2

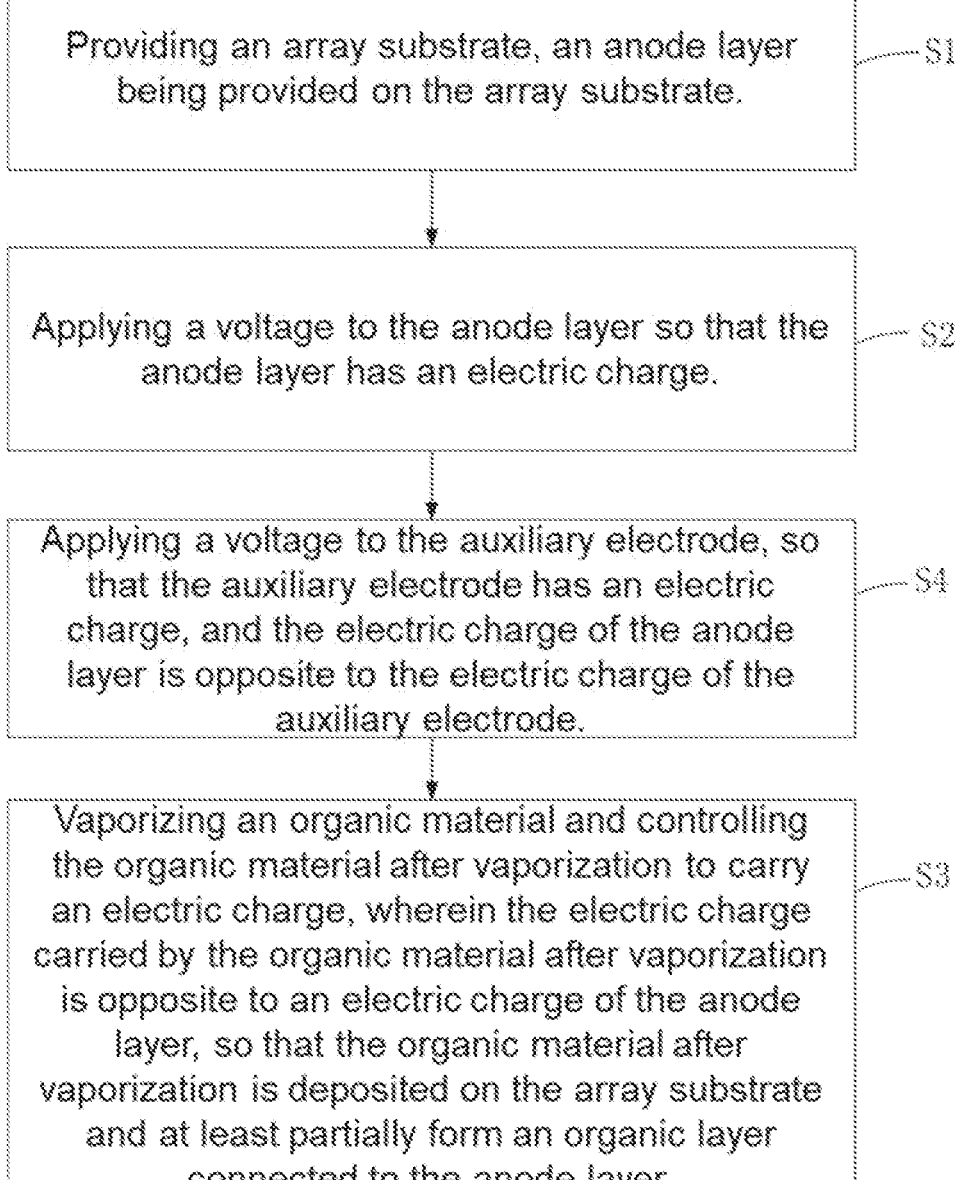

Providing an array substrate, an anode layer being provided on the array substrate. —S1

Applying a voltage to the anode layer so that the anode layer has an electric charge. —S2

Applying a voltage to the auxiliary electrode, so that the auxiliary electrode has an electric charge, and the electric charge of the anode layer is opposite to the electric charge of the auxiliary electrode. —S4

Vaporizing an organic material and controlling the organic material after vaporization to carry an electric charge, wherein the electric charge carried by the organic material after vaporization is opposite to an electric charge of the anode layer, so that the organic material after vaporization is deposited on the array substrate and at least partially form an organic layer connected to the anode layer. —S3

FIG. 3

MANUFACTURING METHOD OF ORGANIC DISPLAY PANEL AND ORGANIC DISPLAY PANEL

FIELD OF DISCLOSURE

The present disclosure relates to a field of display technology, and more particularly, to a manufacturing method of an organic display panel and an organic display panel.

BACKGROUND OF DISCLOSURE

Organic light-emitting diodes (OLEDs) have been widely used in a field of display, lighting, and smart wearable devices due to their advantages of good self-luminous properties, high contrast ratio, fast response, etc.

When a large-sized organic light-emitting display panel is in operation, different degrees of voltage drop occur at different positions of a cathode layer due to a relatively great resistance of the cathode layer. Therefore, currently, there is generally an auxiliary electrode connected to the cathode layer on the organic light-emitting display panel. A voltage that should be applied to the cathode layer is transmitted through the auxiliary electrode to solve a problem of uneven display caused by the voltage drop and enhance a display uniformity of the organic light-emitting display panel.

When depositing an organic material to form an organic layer, a portion of the organic material is generally deposited at the auxiliary electrode, which affects a connection between the cathode layer and the auxiliary electrode and increases a resistance between the cathode layer and the auxiliary electrode. In related technical solutions, the organic material deposited on the auxiliary electrode is mainly broken or removed to reduce an influence of the organic material on the auxiliary electrode, but a process as described above requires an additional mask process and the process is more difficult. Therefore, achieving a fixed-point deposition of the organic material on an anode layer has become an urgent technical problem to be solved.

The technical problem to be solved by the present application is to provide the manufacturing method of an organic display panel, which can facilitate a deposition of the organic material at the anode layer of the array substrate.

SUMMARY

In order to overcome the above-mentioned problems, solutions adopted by the present application are as follows.

On one hand, the present application provides a manufacturing method of an organic display panel, including:

providing an array substrate, wherein the array substrate is provided with an anode layer;

applying a voltage to the anode layer, so that the anode layer has an electric charge;

vaporizing an organic material, and controlling the organic material after vaporization to carry an electric charge, wherein the electric charge carried by the organic material after vaporization is opposite to the electric charge of the anode layer, so that the organic material after vaporization is deposited on the array substrate, so as to at least partially form an organic layer connected to the anode layer.

Optionally, in some embodiments of the present application, the organic material is deposited on the array substrate for a plurality of times, the anode layer in two consecutive deposition processes has opposite electric charges, and the organic material after vaporization in the two consecutive deposition processes carries opposite electric charges.

Optionally, in some embodiments of the present application, controlling the organic material after vaporization to carry the electric charge includes:

emitting positive electrons to the organic material after vaporization, so that the organic material after vaporization carries the electric charge.

Optionally, in some embodiments of the present application, controlling the organic material after vaporization to carry the electric charge includes:

emitting negative electrons to the organic material after vaporization, so that the organic material after vaporization carries the electric charge.

Optionally, in some embodiments of the present application, an auxiliary electrode is disposed on the array substrate, and before the organic material after vaporization is deposited on the array substrate, the manufacturing method further includes:

applying a voltage to the auxiliary electrode, so that the auxiliary electrode has an electric charge, and the electric charge of the anode layer is opposite to the electric charge of the auxiliary electrode.

Optionally, in some embodiments of the present application, the array substrate includes a drive circuit layer electrically connected to the auxiliary electrode, and applying the voltage to the auxiliary electrode includes: applying the voltage to the auxiliary electrode through the drive circuit layer.

Optionally, in some embodiments of the present application, the drive circuit layer includes a wire of the auxiliary electrode electrically connected to the auxiliary electrode, and applying the voltage to the auxiliary electrode through the drive circuit layer includes: applying a voltage to the wire of the auxiliary electrode, so that the auxiliary electrode has the electric charge.

Optionally, in some embodiments of the present application, applying the voltage to the wire of the auxiliary electrode includes: providing a first external wire, so that the first external wire is lapped on the auxiliary electrode and the first external wire is electrically connected to the auxiliary electrode, and applying a voltage to the first external wire, so that the auxiliary electrode has the electric charge.

Optionally, in some embodiments of the present application, the array substrate includes the drive circuit layer electrically connected to the anode layer, and applying the voltage to the anode layer includes: applying the voltage to the anode layer through the drive circuit layer.

Optionally, in some embodiments of the present application, the drive circuit layer includes a data wire, a switch thin-film transistor, and a drive thin-film transistor, a source of the switch thin-film transistor is electrically connected to the data wire, a drain of the switch thin-film transistor is electrically connected to a gate of the drive thin-film transistor, and a drain of the drive thin-film transistor is electrically connected to the anode layer.

Optionally, in some embodiments of the present application, applying the voltage to the anode layer through the array substrate includes:

applying a voltage to a gate of the switch thin-film transistor and the data wire, so as to turn on the gate of the switch thin-film transistor and the gate of the drive thin-film transistor;

applying a voltage to a source of the drive thin-film transistor, so that the anode layer has the electric charge.

Optionally, in some embodiments of the present application, the drive circuit layer includes a detection thin-film transistor and a detection wire, a source of the detection thin-film transistor is electrically connected between the drain of the drive thin-film transistor and the anode layer, and a drain of the detection thin-film transistor is electrically connected to the detection wire.

Optionally, in some embodiments of the present application, applying the voltage to the anode layer through the array substrate includes:

inputting a low electrical level to the gate of the detection thin-film transistor to turn off the detection thin-film transistor;

inputting a low electrical level to the detection wire.

Optionally, in some embodiments of the present application, the auxiliary electrode is disposed on the array substrate, a pixel definition layer is disposed on the array substrate, the pixel definition layer defines a pixel opening and an auxiliary electrode contact hole, the anode layer is exposed on the pixel definition layer through the pixel opening, and the auxiliary electrode is exposed on the pixel definition layer through the auxiliary electrode contact hole.

Optionally, in some embodiments of the present application, before depositing the organic material after vaporization on the array substrate, so as to at least partially form the organic layer connected to the anode layer, further including: printing a fluid organic material in the pixel opening, so as to cure and form a portion of the organic layer.

On another hand, the present application provides organic display panel, including:

an array substrate;

an anode layer, wherein the anode layer is disposed on the array substrate;

an auxiliary cathode, wherein the auxiliary cathode is disposed on the array substrate;

an organic layer, wherein at least a portion of the organic layer is formed by an organic material after vaporization deposited on the array substrate, and an electric charge carried by the organic material after vaporization is opposite to an electric charge of the anode layer, so that the organic layer is covered on the anode layer and exposes the auxiliary cathode.

Optionally, in some embodiments of the present application, an auxiliary electrode has an electric charge, and the electric charge of the anode layer is opposite to the electric charge of the auxiliary electrode.

Optionally, in some embodiments of the present application, the auxiliary electrode is disposed on the array substrate, a pixel definition layer is disposed on the array substrate, the pixel definition layer defines a pixel opening and an auxiliary electrode contact hole, the anode layer is exposed on the pixel definition layer through the pixel opening, and the auxiliary electrode is exposed on the pixel definition layer through the auxiliary electrode contact hole.

Compared with the prior art, the present application has the following advantages:

In the manufacturing method of the organic display panel and the organic display panel provided by the present application, mainly, in an evaporation process of the organic material on the array substrate to form the organic layer, the anode layer of the array substrate and the organic material after vaporization are applied with different electric charges. Therefore, during the evaporation process, the anode layer and the organic material after vaporization can attract each other under an action of an electric field during the evaporation process, thereby achieving a fixed-point deposition of the organic material on the anode layer and preventing or hindering the organic material from depositing on the array substrate, such as the auxiliary electrode and other areas.

BRIEF DESCRIPTION OF DRAWINGS

In order to describe technical solutions in the present invention clearly, drawings to be used in the description of embodiments will be described briefly below. Obviously, drawings described below are only for some embodiments of the present invention, and other drawings can be obtained by those skilled in the art based on these drawings without creative efforts.

FIG. 1 is a schematic view of a flowchart in a first embodiment provided by the present application.

FIG. 2 is a schematic view showing interactions among electric charges carried by an anode layer, an auxiliary electrode, and an organic material after vaporization on an array substrate in the first embodiment provided by the present application.

FIG. 3 is a schematic view of a flowchart that is further detailed in the first embodiment provided by the present application.

Figure 4:
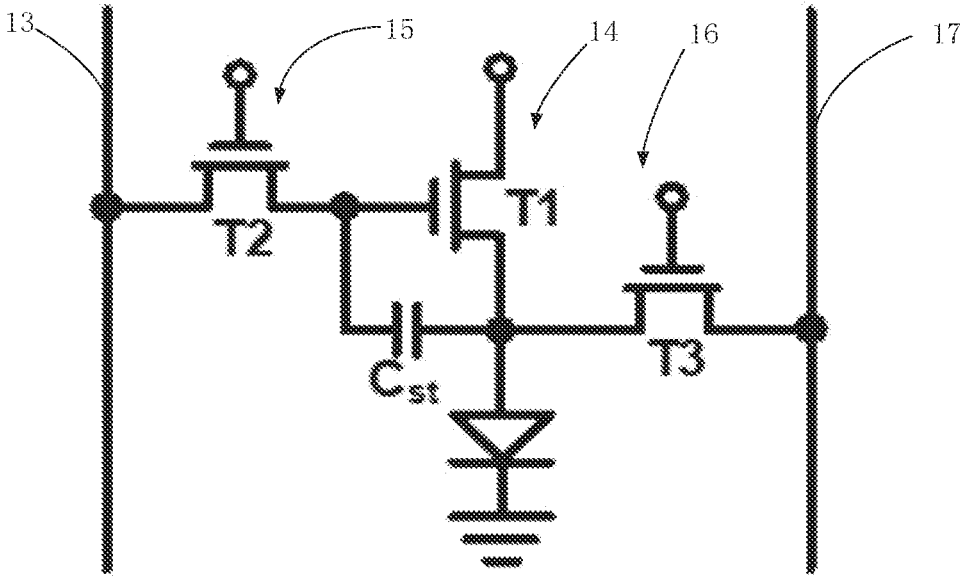
FIG. 4 is a schematic view of a circuit structure at a pixel unit on the array substrate in the first embodiment provided by the present application.

DESCRIPTION OF REFERENCE NUMERALS 10-array substrate, 11-anode layer, 12-auxiliary electrode, 13-data wire, 14-drive thin-film transistor, 15-switch thin-film transistor, 16-detection thin-film transistor, 17-detection wire, 18-pixel definition layer, 19-pixel opening, and 20-auxiliary electrode contact hole.

DETAILED DESCRIPTION OF PRESENT EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the present application.

In the description of the present application, it should be explained that the terms "center", "portrait", "transverse", "length", "width", "thickness", "upper", "lower", "front", the directions or positional relationships indicated by "back", "left", "right", "vertical", "horizontal", "top", "bottom", "inside", "outside", etc. are based on the drawings. The orientation or positional relationship is only for the convenience of describing the present application and simplifying the description, and does not indicate or imply that the device or element referred to must have a specific orientation, structure, and operation in a specific orientation, and should not be viewed as limitations of the present application. In addition, terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features.

In the description of the present application, the meaning of "multiple" is two or more, unless specifically defined otherwise.

The word "exemplary" is used herein to mean "serving as an example, instance, or illustration." Any embodiment or design described herein as "exemplary" is not necessarily to be construed as preferred or advantageous over other embodiments or designs. The following descriptions are presented to enable any person skilled in the art to make and use the invention. Descriptions of specific embodiments and inventions are provided only as examples. Various modifications and combinations of the examples described herein will be readily apparent to those skilled in the art, and the general principles defined herein may be applied to other examples and inventions without departing from the spirit and scope of the invention. Thus, the present invention is not intended to be limited to the examples described and shown, but is to be accorded the widest scope consistent with the principles and features disclosed herein.

EMBODIMENT 1

This embodiment provides a manufacturing method of an organic display panel. Referring to FIG. 1, which is a schematic view of a flowchart in this embodiment provided by the present application. In this embodiment, the manufacturing method includes:

S1: providing an array substrate 10, an anode layer 11 being provided on the array substrate 10;

S2: applying a voltage to the anode layer 11 so that the anode layer 11 has an electric charge; and S3: vaporizing an organic material and controlling the organic material after vaporization to carry an electric charge, wherein the electric charge carried by the organic material after vaporization is opposite to an electric charge of the anode layer 11, so that the organic material after vaporization is deposited on the array substrate 10 and at least partially form an organic layer connected to the anode layer 11.

The above-mentioned electric charges refer to any one of a positive or a negative electric charge. It can be understood that when the electric charge of the anode layer 11 and the electric charge of the organic material after vaporization are opposite to each other, the anode layer 11 and the organic material after vaporization will be attracted to each other under an action of an electric field. Therefore, referring to FIG. 2, arrows indicate a moving trend of the organic material after vaporization. During a process of forming the organic layer through evaporation deposition, the organic material after vaporization is more inclined to move or incline toward the anode layer 11 under the action of the electric field, thereby preventing or hindering the organic material from depositing on other portions of the array substrate 10, such as an auxiliary electrode 12 or the like.

It should be noted that the anode layer 11 can be applied with a positive voltage, so as to have a positive electric charge, and the electric charge carried by the organic material after vaporization is correspondingly negative. The electric charge of the anode layer 11 and the electric charge of the organic material after vaporization are not limited to this. For example, the anode layer 11 can be applied with a negative voltage, so as to have a negative electric charge, and the electric charge carried by the organic material after vaporization is correspondingly positive. As long as the electric charges of the anode layer 11 and the organic material after vaporization are opposite to each other, the anode layer 11 and the organic material after vaporization will be attracted to each other under the action of the electric field.

It should also be noted that the above-mentioned organic layer formed by depositing the organic material is indicated to be a film layer structure mainly including a hole injection layer (HIL), a hole transport layer (HTL), an organic emitting material layer (EML), an electron transport layer (ETL), and an electron injection layer (EIL). The organic material corresponding to different film layers are different, and an implementing person can select a partial portion of one layer of the different film layers, or one layer of the different film layers, or any of a plurality of layers to perform an evaporation process mentioned above according to actual needs. It can be understood that, after a portion of a film layer of the organic layer is deposited on the array substrate 10, this portion of the film layer has a same electric charge as the anode layer 11. It can also be understood that even if only a portion of the organic layer is deposited by the evaporation process mentioned above, a technical effect of preventing the organic material from being deposited on other areas of the array substrate 10 can still be achieved. Certainly, most ideally, the hole injection layer, the hole transport layer, the organic emitting material layer, the electron transport layer, and the electron injection layer mentioned above are all deposited at the anode layer 11 through the evaporation process mentioned above.

Regarding applying the voltage to the anode layer 11, the implementing person can choose a method of applying the voltage to the anode layer 11 according to actual situations.

However, in some cases, there may be cases where the anode layer 11 fails to neutralize all the electric charges in the organic material after vaporization in a certain evaporation process (for example, providing a voltage through passive components), which affects a film-forming effect of the organic layer after a plurality of evaporation processes. For example, in two consecutive evaporation processes, a certain amount of negative electric charges can reside in the electron transport layer after being formed. If a vaporized material of the electron injection layer still carries negative electric charges in a next evaporation process, then its own fixed-point deposition can be affected to an extent. Therefore, in another embodiment, the anode layer 11 in the two consecutive deposition processes has opposite electric charges, and the organic material after vaporization in the two consecutive deposition processes caries opposite electric charges. With an arrangement mentioned above, even if a certain amount of electric charges reside in the organic layer after being formed, subsequent depositions of film layers are not affected. It should be noted here that a target film layer to be deposited and formed in the two consecutive deposition processes can belong to different film layers in the organic layer, or can belong to a same film layer, which is not particularly limited in the present application.

In this embodiment, in order to simplify a process, in each evaporation process, the anode layer 11 is applied with the positive voltage, so as to have the positive electric charge, and the electric charge carried by the organic material after vaporization is negative.

Regarding controlling the electric charge of the organic material after vaporization, in this embodiment, specifically, the organic material after vaporization is charged through emitting positive electrons or negative electrons to the organic material after vaporization. In this embodiment, an electron gun is mainly used to emit the positive electrons or the negative electrons to the organic material after vaporization, and a structure of the electron gun, as long as the organic material after vaporization can be charged, it is not particularly limited here. The implementing person can also choose other methods to control the electric charge of the organic material after vaporization. For example, having the organic material after vaporization accelerate and flow through a nozzle, so as to be rubbed against an inner wall of the nozzle, thereby causing the organic material after vaporization from an evaporation source to carry the electric charge.

As described above, for a current organic display panel, an entire transparent metal layer is adopted as a cathode layer, which causes the cathode layer to have a relatively great resistance and produce different degrees of voltage drop at different positions of the cathode layer. Therefore, some technical features of arranging the auxiliary electrode 12 on the array substrate 10 have appeared in related technical solutions, and a voltage that should be applied to the cathode layer is transmitted through the auxiliary electrode 12 to solve a problem of uneven display caused by the voltage drop in a display panel and enhance a display uniformity of an organic light-emitting display panel.

Referring to FIG. 3, which is a schematic view of the manufacturing method that is further detailed provided in this embodiment. The manufacturing method provided by this embodiment further prevents the organic material from depositing at the auxiliary electrode 12. Before the organic material after vaporization is deposited on the array substrate 10, the manufacturing method further includes:

S4: applying a voltage to the auxiliary electrode 12, so that the auxiliary electrode 12 has an electric charge, and the electric charge of the anode layer 11 is opposite to the electric charge of the auxiliary electrode 12.

Similar to descriptions mentioned above, since the electric charge of the anode layer 11 is opposite to the electric charge of the auxiliary electrode 12, the electric charge of the auxiliary electrode 12 and the electric charge carried by the organic material after vaporization are same as each other, specifically negatively charged, and the auxiliary electrode 12 and the organic material after vaporization have a tendency of repelling each other under the action of the electric field, thereby preventing or hindering the organic material after vaporization from being deposited at the auxiliary electrode 12 during the evaporation process. Compared with a conventional method of removing the organic material deposited at the auxiliary electrode 12 through a mask, the manufacturing method provided in this embodiment omits a mask process and is easier to be achieved in terms of process.

Further, for the anode layer 11 and the auxiliary electrode 12, both can be applied with a voltage in a manner of connecting to an external wire, so as to have different electric charges.

For example, in another embodiment, applying the voltage to the auxiliary electrode 12 includes: providing a first external wire, so that the first external wire is lapped on the auxiliary electrode 12 and the first external wire is electrically connected to the auxiliary electrode 12, and applying a voltage to the first external wire, so that the auxiliary electrode 12 has a positive or a negative electric charge. At a same time, applying the voltage to the anode layer 11 includes: providing a second external wire, so that the second external wire is lapped on the anode layer 11 and the anode layer 11 is electrically connected to the second external wire, and applying a voltage to the second external wire, so that the anode layer 11 has a positive or a negative electric charge.

For an organic display panel, additional external wires have a certain impact on a normal evaporation deposition of the organic layer. In addition, the anode layer 11 and the auxiliary electrode 12 are generally independently arranged in pixel units arranged in an array. A number of the pixel units is relatively large, which increases a difficulty of arranging external wires.

Therefore, in this embodiment, applying the voltage to the auxiliary electrode 12 includes: applying the voltage to the auxiliary electrode 12 through a drive circuit layer on the array substrate 10. An existing structure of the drive circuit layer in the array substrate 10 is adopted to apply the voltage to the auxiliary electrode 12, and on a basis of achieving the auxiliary electrode 12 having an electric charge, an arrangement of an external wire can be omitted, which facilitates a large-scale production of the organic display panel.

In detail, in this embodiment, the drive circuit layer includes a wire of the auxiliary electrode 12 that is electrically connected to the auxiliary electrode 12, and applying the voltage to the auxiliary electrode 12 through the drive circuit layer includes: applying a voltage to the wire of the auxiliary electrode 12, so that the auxiliary electrode 12 has the electric charge.

Based on a same principle, in this embodiment, applying the voltage to the anode layer 11 includes: applying the voltage to the anode layer 11 through the drive circuit layer on the array substrate 10. As described above, the existing structure of the drive circuit layer in the array substrate 10 is adopted to apply the voltage to the anode layer 11, and on a basis of achieving the anode layer 11 having an electric charge, the arrangement of the external wire can be omitted, which facilitates the large-scale production of the organic display panel.

In detail, referring to FIG. 4, which is a schematic view of a circuit structure at the pixel units on the array substrate 10. Here, for convenience of understanding, a schematic view of the circuit structure after the display panel is manufactured is schematically illustrated.

It can be seen from FIG. 4 that, in this embodiment, the drive circuit layer includes a data wire 13, a switch thin-film transistor 15, and a drive thin-film transistor 14. A source of the switch thin-film transistor 15 is electrically connected to the data wire 13, a drain of the switch thin-film transistor 15 is electrically connected to a gate of the drive thin-film transistor 14, and a drain of the drive thin-film transistor 14 is electrically connected to the anode layer 11.

In addition, applying the voltage to the anode layer 11 through the array substrate 10 includes:

applying a voltage to a gate of the switch thin-film transistor 15 and the data wire 13 to turn on the gate of the switch thin-film transistor 15 and the gate of the drive thin-film transistor 14; and applying a voltage to a source of the drive thin-film transistor 14, so that the anode layer 11 has the electric charge.

In this embodiment, a high electrical level is mainly applied to the gate of the switch thin-film transistor 15 and the data wire 13, so that the gate of the switch thin-film transistor 15 and the gate of the drive thin-film transistor 14 are turned on. At this time, by applying a corresponding voltage to the source of the drive thin-film transistor 14, the anode layer 11 connected to the drain of the drive thin-film transistor 14 can have a corresponding electric charge.

It should be noted that the implementing person can apply an electrical signal to a test pad for testing, i.e., an AT pad, on the array substrate 10, so that the drive circuit layer applies the voltage to the anode layer 11 and the cathode layer. For example, the test pad enables the gate of the switch thin-film transistor 15 and the data wire 13 to be applied with a high level, and applies a corresponding voltage to the source of the drive thin-film transistor 14. In addition, the implementing person can arrange a fixture adapted to the test pad on an evaporation equipment for applying the electrical signal, as described above, to the test pad.

In addition, referring further to FIG. 4, in this embodiment, the pixel units are also each provided with a detection wire 17 and a detection thin-film transistor 16, when the drive circuit layer applies a voltage to the anode layer 11, the detection wire 17 and the gate of the detection thin-film transistor 16 are inputted with a low electrical level, so that the detection thin-film transistor 16 is in an off state.

Figure 5:
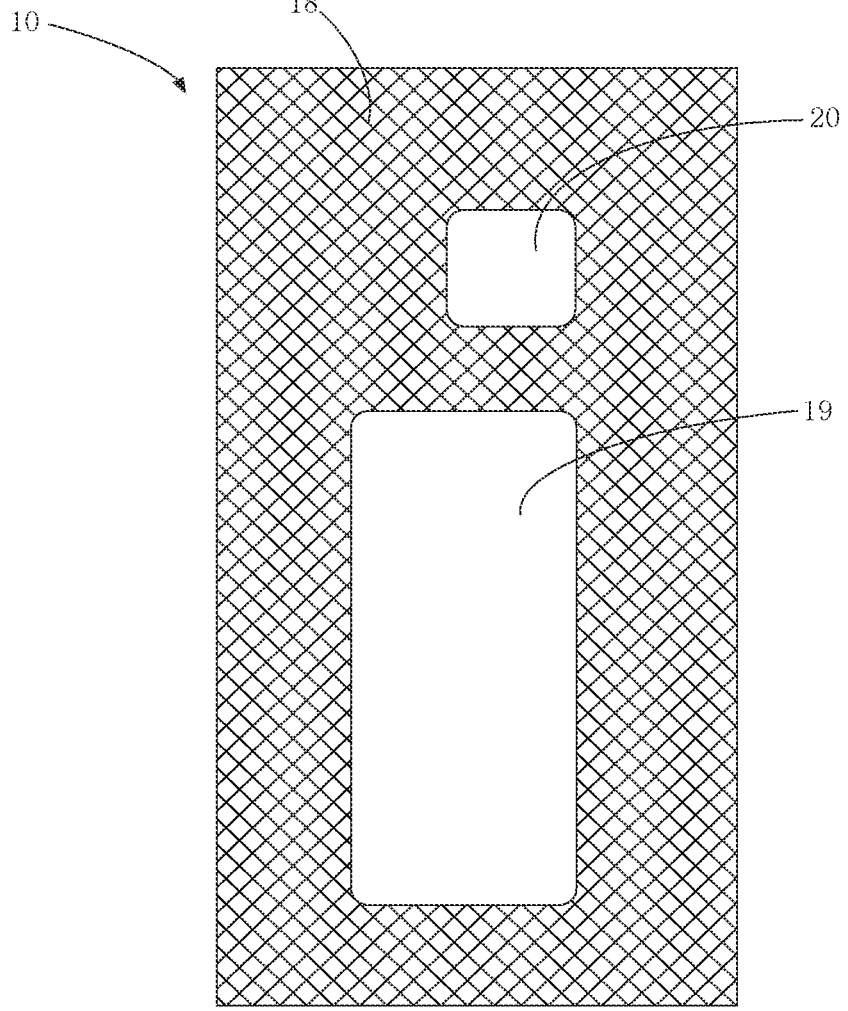
FIG. 5 is a schematic view of locations of a pixel opening and an auxiliary electrode on the array substrate in the first embodiment provided by the present application.

Furthermore, for the organic layer, since organic materials of different layers have different molecular structures, different methods can be used for deposition. Therefore, referring to FIG. 5, in this embodiment, the auxiliary electrode 12 is disposed on the array substrate 10, a pixel definition layer 18 is disposed on the array substrate 10, the pixel definition layer 18 defines a pixel opening 19 and an auxiliary electrode contact hole 20, the anode layer 11 is exposed on the pixel definition layer 18 through the pixel opening 19, and the auxiliary electrode 12 is exposed on the pixel definition layer 18 through the auxiliary electrode contact hole 20.

Based on this structure, before evaporating the organic material on the array substrate 10 to at least partially form the organic layer deposited on the anode layer 11, the manufacturing method can include steps:

printing a fluid organic material in the pixel opening 19, so as to cure and form a portion of the organic layer.

In detail, in this embodiment, the hole injection layer, the hole transport layer, and the organic emitting material layer in the organic layer are sequentially deposited in the pixel opening 19 through a method of fixed-point ink printing and form the portion of the organic layer after curing. The electron transport layer and the electron injection layer are deposited by the evaporation deposition as described above. It should be noted here that, as described above, a most ideal deposition method for the organic layer is that the hole injection layer, the hole transport layer, the organic emitting material layer, the electron transport layer, and the electron injection layer are all deposited at the anode layer 11 through the evaporation process as described above. This is because in solution deposition methods such as printing and spin coating, some of the fluid organic material can overflow to the auxiliary electrode contact hole 20, and form a film layer after curing, thereby affecting a contacting effect between the auxiliary electrode 12 and the cathode layer that is subsequently formed.

After the organic layer is manufactured, the cathode layer can be disposed on the array substrate 10. At this time, since only a small amount of the organic material or none of the organic material reside at the auxiliary electrode 12, so that the auxiliary electrode 12 and the cathode layer can form a good contact, and further effectively enhance the display uniformity of the display panel.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure, or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Similarly, it should be noted that in order to simplify the description disclosed in the present application and thereby help to understand one or more embodiments, the above description of the embodiments of the present application sometimes incorporates multiple features into one embodiment, one figure or one description of it. However, this disclosure method does not mean that the present disclosure object requires more features than the features mentioned in the claims. Rather, claim subject matter lies in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters set forth in the description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each patent, patent application, patent application publication and other materials cited herein, such as articles, books, instructions, publications, documents, etc., are hereby incorporated by reference in their entirety. Application history documents that are inconsistent or conflicting with the contents of the present application are excluded, and documents (currently or later attached to the present application) that limit the widest range of the scope of the present application are also excluded. It is to be noted that if the description, definition, and/or terminology used in the appended application of the present application is inconsistent or conflicting with the contents described in this application, the description, definition and/or terminology may be subject to the present application.

What is claimed is:

1. A manufacturing method of an organic display panel, comprising:

providing an array substrate, wherein the array substrate is provided with an anode layer;

applying a voltage to the anode layer, so that the anode layer has an electric charge; and vaporizing an organic material, and controlling the organic material after vaporization to carry an electric charge, wherein the electric charge carried by the organic material after vaporization is opposite to the electric charge of the anode layer, so that the organic material after vaporization is deposited on the array substrate, so as to at least partially form an organic layer connected to the anode layer;

wherein the organic material is deposited on the array substrate in a plurality of times, wherein the anode layer in two consecutive deposition processes has opposite electric charges, the organic material after vaporization in the two consecutive deposition processes carries opposite electric charges, and films formed in the two consecutive deposition processes are two different sub-layers of the organic layer.

2. The manufacturing method of the organic display panel according to claim 1, wherein controlling the organic material after vaporization to carry the electric charge comprises:

emitting positive electrons to the organic material after vaporization, so that the organic material after vaporization carries the electric charge.

3. The manufacturing method of the organic display panel according to claim 1, wherein controlling the organic material after vaporization to carry the electric charge comprises:

emitting negative electrons to the organic material after vaporization, so that the organic material after vaporization carries the electric charge.

4. The manufacturing method of the organic display panel according to claim 1, wherein an auxiliary electrode is disposed on the array substrate, and before the organic material after vaporization is deposited on the array substrate, the manufacturing method further comprises:

applying a voltage to the auxiliary electrode, so that the auxiliary electrode has an electric charge, and the electric charge of the anode layer is opposite to the electric charge of the auxiliary electrode.

5. The manufacturing method of the organic display panel according to claim 4, wherein the array substrate comprises a drive circuit layer electrically connected to the auxiliary electrode, and applying the voltage to the auxiliary electrode comprises: applying the voltage to the auxiliary electrode through the drive circuit layer.

6. The manufacturing method of the organic display panel according to claim 5, wherein the drive circuit layer comprises a wire of the auxiliary electrode electrically connected to the auxiliary electrode, and applying the voltage to the auxiliary electrode through the drive circuit layer comprises: applying a voltage to the wire of the auxiliary electrode, so that the auxiliary electrode has the electric charge.

7. The manufacturing method of the organic display panel according to claim 4, wherein applying the voltage to the wire of the auxiliary electrode comprises: providing a first external wire, so that the first external wire is lapped on the auxiliary electrode and the first external wire is electrically connected to the auxiliary electrode, and applying a voltage to the first external wire, so that the auxiliary electrode has the electric charge.

8. The manufacturing method of the organic display panel according to claim 1, wherein the array substrate comprises a drive circuit layer electrically connected to the anode layer, and applying the voltage to the anode layer comprises: applying the voltage to the anode layer through the drive circuit layer.

9. The manufacturing method of the organic display panel according to claim 8, wherein the drive circuit layer comprises a data wire, a switch thin-film transistor, and a drive thin-film transistor, a source of the switch thin-film transistor is electrically connected to the data wire, a drain of the switch thin-film transistor is electrically connected to a gate of the drive thin-film transistor, and a drain of the drive thin-film transistor is electrically connected to the anode layer.

10. The manufacturing method of the organic display panel according to claim 9, wherein applying the voltage to the anode layer through the array substrate comprises:

applying a voltage to a gate of the switch thin-film transistor and the data wire, so as to turn on the gate of the switch thin-film transistor and the gate of the drive thin-film transistor; and applying a voltage to a source of the drive thin-film transistor, so that the anode layer has the electric charge.

11. The manufacturing method of the organic display panel according to claim 10, wherein the drive circuit layer comprises a detection thin-film transistor and a detection wire, a source of the detection thin-film transistor is electrically connected between the drain of the drive thin-film transistor and the anode layer, and a drain of the detection thin-film transistor is electrically connected to the detection wire.

12. The manufacturing method of the organic display panel according to claim 11, wherein applying the voltage to the anode layer through the array substrate further comprises:

inputting a low electrical level to a gate of the detection thin-film transistor to turn off the detection thin-film transistor; and inputting a low electrical level to the detection wire.

13. The manufacturing method of the organic display panel according to claim 1, wherein an auxiliary electrode is disposed on the array substrate, a pixel definition layer is disposed on the array substrate, the pixel definition layer defines a pixel opening and an auxiliary electrode contact hole, the anode layer is exposed on the pixel definition layer through the pixel opening, and the auxiliary electrode is exposed on the pixel definition layer through the auxiliary electrode contact hole.

14. The manufacturing method of the organic display panel according to claim 13, before depositing the organic material after vaporization on the array substrate, so as to at least partially form the organic layer connected to the anode layer, further comprising: printing a fluid organic material in the pixel opening, so as to cure and form a portion of the organic layer.

* * * * *